United States Patent
Bertagnolli et al.

(10) Patent No.: US 6,642,565 B2
(45) Date of Patent: Nov. 4, 2003

(54) MINIATURIZED CAPACITOR WITH SOLID-STATE DIELECTRIC, IN PARTICULAR FOR INTEGRATED SEMICONDUCTOR MEMORIES, E.G. DRAMS, AND METHOD FOR FABRICATING SUCH A CAPACITOR

(75) Inventors: Emmerich Bertagnolli, Vienna (AT); Till Schlösser, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/935,624

(22) Filed: Aug. 23, 2001

(65) Prior Publication Data

US 2002/0036312 A1 Mar. 28, 2002

Related U.S. Application Data

(63) Continuation of application No. PCT/DE00/00436, filed on Feb. 16, 2000.

(30) Foreign Application Priority Data

Feb. 23, 1999 (DE) ......................................... 199 07 760

(51) Int. Cl.[7] ............................................. H01L 27/108
(52) U.S. Cl. ...................... 257/300; 257/303; 257/306; 438/250; 438/393
(58) Field of Search ................................ 257/300, 303, 257/306; 438/250, 244, 393, 253, 387, 396

(56) References Cited

U.S. PATENT DOCUMENTS

| | | | |
|---|---|---|---|
| 5,656,529 A | 8/1997 | Fukase | ........................ 438/398 |
| 5,760,434 A | 6/1998 | Zahurak et al. | |
| 5,877,063 A | 3/1999 | Gilchrist | |
| 5,981,330 A | * 11/1999 | Jenq | ........................... 438/238 |
| 6,344,389 B1 | * 2/2002 | Bronner et al. | ............. 438/244 |

FOREIGN PATENT DOCUMENTS

EP 0 553 791 A1 8/1993

OTHER PUBLICATIONS

Döscher et al.: "A study on Wsi$_2$ thin films, formed by the reaction of tungsten with solid or liquid silicon, by rapid thermal annealing" Thin Solid Films, CH, Elsevier–Sequoia S.A., Lausanne, vol. 239, No. 2, Mar. 1, 1994, pp. 251–258.
German Examination Report dated Dec. 6, 1999.

* cited by examiner

Primary Examiner—Nathan J. Flynn
Assistant Examiner—Scott R. Wilson
(74) Attorney, Agent, or Firm—Laurence A. Greenberg; Werner H. Stemer; Ralph E. Locher

(57) ABSTRACT

A dynamic random access memory capacitor and to a method for producing the same are described. A first (bottom) electrode of the capacitor has a grained surface made of tungsten silicide placed on a tungsten silicide layer which is disposed near a surface of a electrode body. The graining of the tungsten silicide layer is formed by tempering a temporarily present double layer that is formed of an understoichiometric tungsten silicide layer and a silicon layer. The double layer is formed on the tungsten silicide layer.

11 Claims, 3 Drawing Sheets

MINIATURIZED CAPACITOR WITH SOLID-STATE DIELECTRIC, IN PARTICULAR FOR INTEGRATED SEMICONDUCTOR MEMORIES, E.G. DRAMS, AND METHOD FOR FABRICATING SUCH A CAPACITOR

CROSS-REFERENCE TO RELATED APPLICATION

This application is a continuation of copending International Application No. PCT/DE00/00436, filed Feb. 16, 2000, which designated the United States.

BACKGROUND OF THE INVENTION

1. Field of the Invention

The present invention relates to a miniaturized capacitor with a solid-state dielectric (MIM or MIS capacitor), as can advantageously be used in particular for integrated semiconductor circuits and preferably for memories, for example dynamic random access memories (DRAMs). Capacitors of this type are known, for example, from U.S. Pat. No. 5,760,434, Published, British Patent Application GB 2 294 591 A, Published, European Patent Application EP 0 553 791 A, IEDM 1998 San Francisco: Y. S. Chun et al. and 1997 Symp. On VLSI Tech. Digest of Tech. Papers: J. M. Drynan et al., pp. 151, 152.

Tantalum oxide ($Ta_2O_5$) capacitors have been known for decades. Their high specific capacitance is substantially based on the relatively high dielectric constant and the low thickness of the tantalum oxide dielectric layer. Furthermore, a surface area which is as large as possible is important for a high specific capacitance, in which case, as is known in particular from electrolytic capacitors, an enlarged-area surface, which has been roughened as much as possible, of the electrode is of importance.

MIM/MIS capacitors have already long been used for dynamic random access memories (DRAMs). Capacitors which have a first electrode made from tungsten, a tantalum pentoxide dielectric and a second electrode made from, for example, titanium nitride (TiN) are known from the reference by Drynan et al., 1997, Symposium on VLSI Technology Digest of Technical Papers, pp. 151 to 152. It is also known (EP 0 553 791), in a capacitor with a silicon semiconductor electrode, to produce a roughened surface of the electrode by anodic etching, selective etching, etching with the additional action of UV light, dry etching of silicon or of an amorphous silicon layer or by recrystallization of an amorphous silicon layer which was previously applied (known as the hemispherical graining (HSG) process).

A DRAM capacitor and its fabrication method are known from U.S. Pat. No. 5,760,434. One capacitor electrode, which is referred to as the bottom electrode and is connected to the transistor of the memory cell, in this document consists of TiN. It is in this case a thin film in the form of a cup on silicon oxide which forms the surrounding side wall. The inner wall of the TiN layer, which is of a cup-like shape, is coated with silicon. The silicon is converted into hemispherical grained silicon with the aid of the HSG process, so that the silicon on the TiN substrate which remains unchanged has the known grained structure/structural surface with a surface area which has been enlarged a number of times. This enlarged surface area of the conductive HSG polysilicon forms the electrode surface with is coated with a dielectric. The dielectric is coated with the second electrode (top electrode) to complete the capacitor.

SUMMARY OF THE INVENTION

It is accordingly an object of the invention to provide a miniaturized capacitor with a solid-state dielectric, in particular for integrated semiconductor memories, e.g. DRAMs, and a method for fabricating such a capacitor which overcome the above-mentioned disadvantages of the prior art devices and methods of this general type, in which the two electrodes which adjoin the dielectric, in particular the surface of the bottom electrode, consist of an electronically conductive metal with a correspondingly high electrical conductivity, yet nevertheless the electrode surface has a greatly enlarged surface area, as can be achieved with the HSG process for semiconductor materials.

With the foregoing and other objects in view there is provided, in accordance with the invention, a miniaturized capacitor containing a first metal electrode having a predetermined macroscopic form. The first metal electrode has a surface and a region formed of tungsten silicide disposed close to the surface. The first metal electrode has a grown layer containing grained tungsten silicide forming an enlarged surface area disposed on a surface of the region. A solid-state dielectric is disposed on the first metal electrode including the region having the enlarged surface area. A second electrode is disposed on the solid-state dielectric.

The particular features of the present invention can be seen in particular from an advantageous fabrication method according to the invention, which is described below, for the miniaturized solid-state capacitor according to the invention.

For a DRAM capacitor, it is known to provide a form with a macroscopically enlarged surface area for its first (bottom) electrode. By way of example, this may be, as well as the form of a bell or the form of a bore, the form of a column.

Macroscopic forms of this type are sufficiently well known for the relevant capacitors in order to achieve a high capacitance.

In the invention, it is provided that the material of the first electrode, at least in the region below its electrode surface, has an electrical conductivity that is as good as possible. Therefore, according to the invention, either the entire electrode or at least that region of the electrode that is close to the surface is formed of tungsten silicide, which has a good electronic, i.e. metallic, conductivity. For the second case described above, it is alternatively possible, for the invention, to provide polysilicon as the core with a tungsten silicide region which is close to the surface.

According to the invention, the tungsten silicide of the first electrode or at least of its region which is close to the surface contains a stoichiometric excess of silicon. The silicon content may be x=2.0 to 2.5 in the $WSi_x$.

A first layer of tungsten silicide which is in this case substoichiometric, for example $WSi_{1.8}$, with a silicon content of between, for example, 1.5 and 1.9, is applied to the surface of this preferably superstoichiometric tungsten silicide. The thickness of a layer of this type is approximately 10 to 30 nm. A layer of this type can be applied, for example, using known chemical vapor deposition (CVD) processes using, for example, tungsten fluoride ($WF_6$) and, for example, silane.

A further layer of pure silicon, or silicon without any additives, is applied to the first layer, once again, for example, with the aid of a CVD process. This layer is, for example, 10 to 30 nm thick.

The first (bottom) electrode with these two coatings then undergoes a heat treatment at, for example, 800 to 1100° C. for from, for example, 1 to 10 sec in an inert atmosphere. During the process step, the material of the substoichiometric first layer changes into at least substantially stoichiometric tungsten silicide $WSi_2$. The invention exploits the fact that, with the process parameters indicated, this transition to stoichiometric tungsten silicide is accompanied by growth of graining. This is grain growth in or at least on the surface of the first layer. The graining of the first layer that occurs results in a significantly enlarged surface area of the electrode surface of the first electrode that is of relevance for the capacitor.

In the method step of the invention that follows, the silicon of the second layer that is still present is etched away down to the first layer, which now has the graining. Consequently, the tungsten silicide surface is completely exposed. It is now recommended to passivate the grained surface of the first electrode. A thermal nitride coating in substantially a single layer, for example with a thickness of less than 1 nm, is suitable for this purpose. The formation of nitride may take place in particular through the action of $NH_3$. The purpose of the passivation is to avoid the formation of any silicon dioxide on the electrode surface. This would in fact considerably reduce the capacitance of the capacitor.

Then, the actual dielectric, for example SiN, of the capacitor according to the invention is applied to the surface of the first electrode which has been fabricated according to the invention and of which the surface area has been enlarged a number of times by the graining achieved. For this application, CVD of SiN from, for example, $NH_3$ and silane is suitable. In addition, it is advantageously possible, in order to reduce the defect density, for the nitride to be—preferably only partially—oxidized, so that a thin oxide layer, known as top oxide, is formed. The oxidation to a depth of, for example, up to 1 nm into the SiN dielectric layer leads to saturation of open bonds.

The dielectric which is deposited on the nitride passivation may alternatively also be tantalum pentoxide as a layer applied by a CVD process or an organic tantalum compound or the like which it is known can be used for this purpose. It is recommended for the surface of the tantalum oxide dielectric that has been applied as described above also to be subjected to a heat treatment in an oxygen-containing atmosphere. This measure has the effect of reducing the defect density within the dielectric layer, in particular in the grain boundaries of the dielectric. In this way, it is possible to significantly reduce the leakage current, which represents a drawback for a capacitor.

The pinhole density can also be reduced using these two measures that have been described above for reducing the defect density.

The thickness of the particular dielectric layer is dependent on the dielectric strength required for the capacitor. Although a relatively thick layer reduces the specific capacitance of the capacitor that can be achieved, it increases the dielectric strength of the capacitor. An oxide-equivalent thickness of the layer of between approximately 1 and 5 nm is typical.

The free surface area of the dielectric is covered with the second electrode of the capacitor. The second electrode may consist, for example, of titanium nitride, polysilicon, tungsten, tungsten nitride, tungsten silicide and the like.

In accordance with an added feature of the invention, the first metal electrode has a core formed of polysilicon and the region is disposed on the core.

In accordance with an additional feature of the invention, the solid-state dielectric is a nitride-oxide double layer or is formed of tantalum pentoxide.

In accordance with a further feature of the invention, the second electrode is formed of titanium nitride or tungsten silicide.

With the foregoing and other objects in view there is provided, in accordance with the invention, a method for fabricating a miniaturized capacitor. The method includes the steps of providing an oxide layer having a recess formed therein; fabricating a macroscopically formed body forming part of a first electrode in the recess of the oxide layer, the body having a region formed of tungsten silicide; and coating the region of the body with a layer of substoichiometric tungsten silicide, $WSi_x$, with x being between 1.5 and 1.9. A further layer of additive-free silicon is applied to the layer of sustoichiometirc tungsten silicide resulting in a two-layer structure. The body with the two-layer structure is heat treated in an inert atmosphere, until a grained layer substantially formed of the layer of substoichiometric tungsten silicide is formed. The body with the grained layer is coated with a dielectric layer, and a second electrode is formed on the dielectric layer.

In accordance with an added mode of the invention, there is the step of fabricating the body all the way through from the tungsten silicide, $WSi_x$, where x=2 to 2.5.

In accordance with an additional mode of the invention, there is the step of fabricating an inner core of the body from polysilicon, the region of body formed from the tungsten silicide is $WSi_x$, where x=2 to 2.5 and is disposed on the inner core.

In accordance with a further mode of the invention, there is the step of applying the layer of substoichiometric tungsten silicide at a thickness of between 10 and 30 nm.

In accordance with another mode of the invention, there are the steps of forming the oxide layer on an etch stop layer and the recess formed in the oxide layer continues in the etch stop layer; removing the oxide layer after the body is formed; and applying the layer of substoichiometric tungsten silicide on the body and on the etch stop layer such that, on the body, the layer of substoichiometric tungsten silicide layer is applied at a thickness which is at least twice as that as on the etch stop layer.

In accordance with a further added mode of the invention, there is the step of applying the further layer to a thickness of between 10 and 30 nm and carrying out the heat treating step continuously in an inert atmosphere at 800° to 1100° C. for from 1 to 10 seconds. The parts of the further layer that remain on the grained layer are removed after the heat treating step.

In accordance with a further additional mode of the invention, there is the step of passivating a surface of the grained layer forming the dielectric layer. The passivation step is performed by thermal nitride coating. In addition, the passivation step can be carried out with a single-layer thickness of less than 1 nm.

Other features which are considered as characteristic for the invention are set forth in the appended claims.

Although the invention is illustrated and described herein as embodied in a miniaturized capacitor with a solid-state dielectric, in particular for integrated semiconductor memories, e.g. DRAMs, and a method for fabricating such a capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
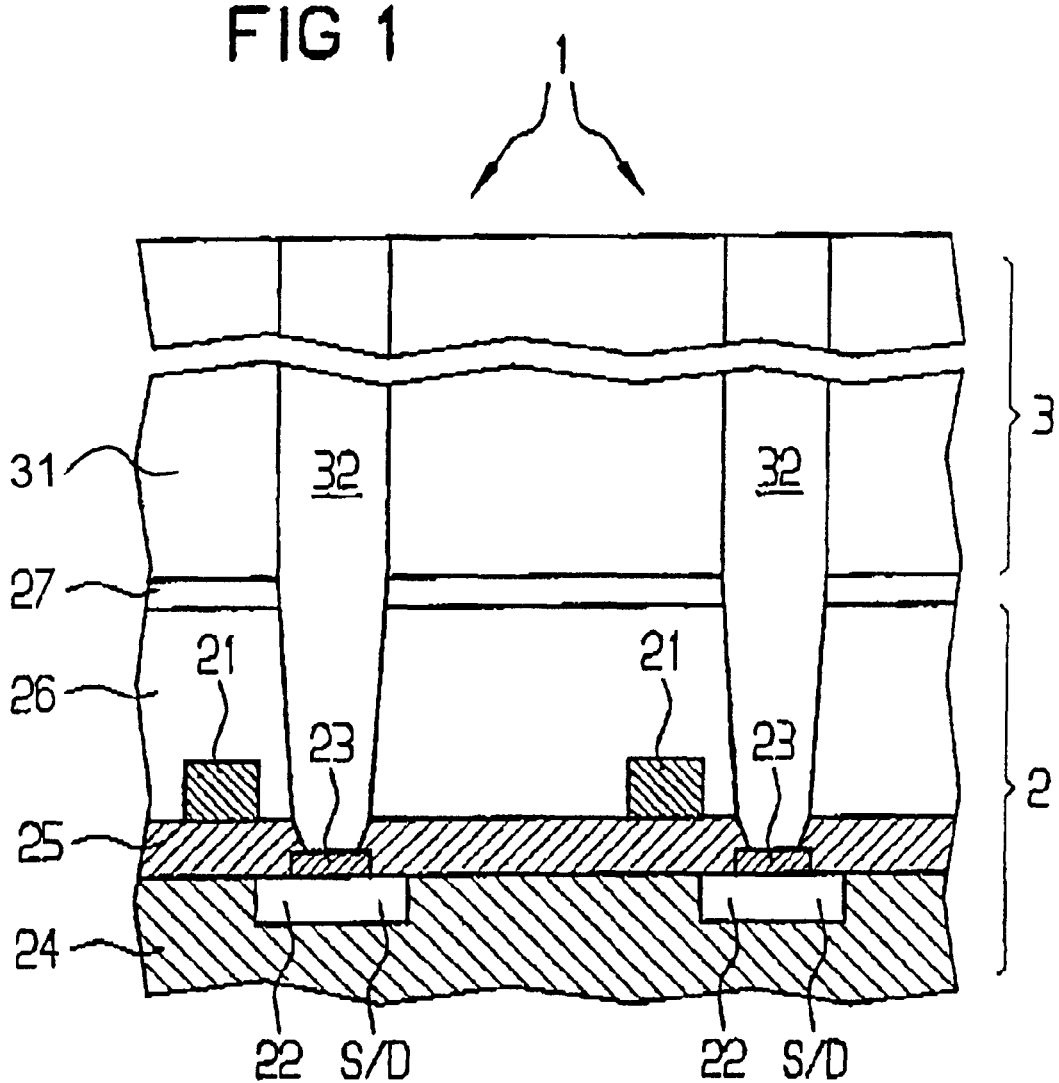
FIG. 1 is a diagrammatic, sectional view of first method steps in the fabrication of a first electrode of a capacitor according to the invention.

In all the figures of the drawing, sub-features and integral parts that correspond to one another bear the same reference symbol in each case. Referring now to the figures of the drawing in detail and first, particularly, to FIG. 1 thereof, there are shown first steps for a formation of two adjacent DRAM memory cells illustrated in section in FIG. 1. The known structure of the electronics of a memory (without word lines being illustrated) for two such memory cells 2 is shown. Two bit lines 21 are shown. Two source/drain regions 22 of the two memory cells are shown. Landing pads, which form an electrical connection between the respective source region and a storage capacitor, which is yet to be described, are denoted by 23. A semiconductor substrate 24, an electrical insulator layer 25 and a layer which is known as an intermediate dielectric (BPSG) layer 26 are shown. The dielectric layer 26 is covered with a layer 27 that serves as an etching stop and consists, for example, of a nitride.

The region of the structure shown in FIG. 1 that is denoted by 3 is provided for the capacitor according to the invention and its fabrication. An oxide layer 31 is initially applied to the entire surface of the layer 27 and contains, for example, silicon oxide. The oxide layer 31 is also known as a frame layer. A thickness of the oxide layer 31 is, for example, from 500 to 1000 nm. As can be seen from FIG. 1, a recess or hole 32 is etched into the oxide layer 31 for a corresponding capacitor of the invention. The form of the recess 32 depends on the desired macroscopic form of a first electrode. To position each of the holes 32, a photolithographic mask is formed on an upper surface of the oxide layer 31. The respective hole 32 is etched all the way down to an upper surface of the corresponding landing pad 23, including through the etching stop layer 27 and into the insulator layer 25. The approximate size of the hole 32 of this type is, for example, 150 nm.

Figure 2:
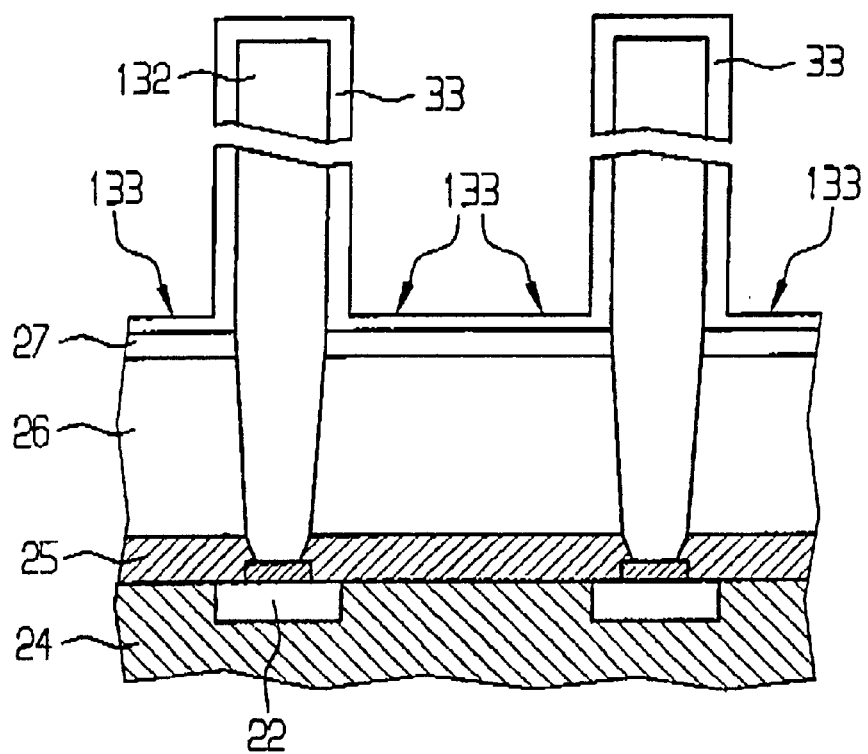
FIGS. 2, 2a, 2b to 5 are sectional views showing further method steps.

After the respective holes 32 have been produced in the oxide layer 31, the holes 32 are filled with tungsten silicide with, in particular, a stoichiometric excess of silicon (WSi$_{2-2.5}$) in accordance with a first variant. Then, the oxide layer 31 is removed again by etching. As a result, the tungsten silicide above the etching stop layer 27 in each case becomes a free-standing columnar body 132 (FIG. 2). The body 132 is in electrical contact with the landing pad 23 and therefore with the source region 22 of the memory transistor.

Figure 2A:
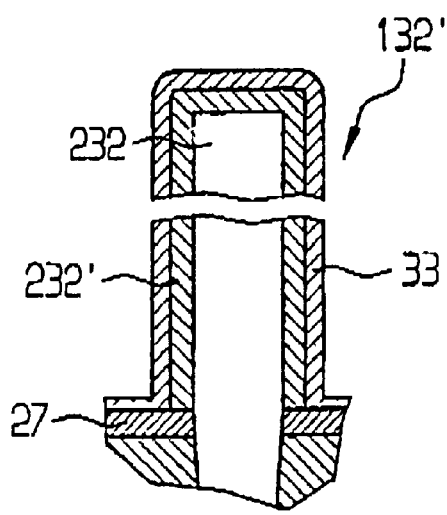

It has already been mentioned above that the first (bottom) electrode, in particular in its region close to the surface, consists of the abovementioned tungsten silicide, while the core of the electrode may also, for example, be polysilicon. As an alternative to the procedure outlined above, according to the invention the respective holes 32 in the frame layer 31 can also be filled with polysilicon doped for conductivity. Columns 232 which are formed after the oxide layer 31 has been etched away and then consist of the polysilicon are then coated with tungsten silicide, as described above, at a region close to the surface, in a thickness which is such that the result is a capacitor electrode which has practically as good a conductivity as an electrode which consists entirely of the tungsten silicide. FIG. 2a shows, as an excerpt, a column 132' of this type with the core 232 of polysilicon and with a region 232' of the tungsten silicide described which is close to the surface.

Figure 2B:
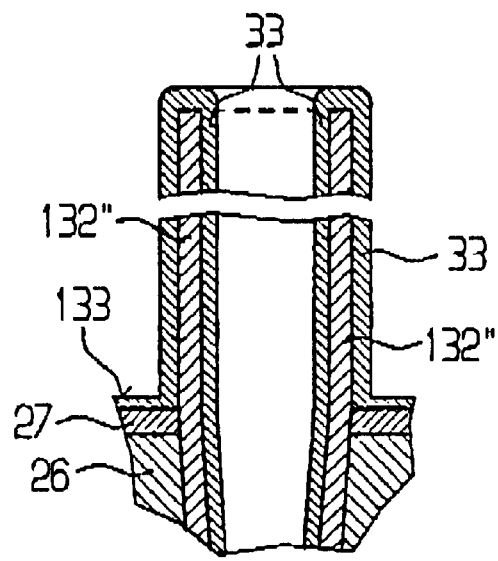

Yet another alternative for the macroscopic form of the first (bottom) electrode is shown in FIG. 2b. In the recess, for example the hole 32, in the layer 31 which has been produced as shown in FIG. 1, the tungsten silicide which is provided, according to the invention, for the first electrode at least in that region of the electrode which is close to the surface is deposited on the wall of the recess/hole 32 as a layer, specifically in such a way that there is an electrical connection with the landing pad 23 (and therefore with the source region 22). The layer is constructed in such a manner that it remains stable as a hollow cylindrical body 132", specifically when the remainder of the layer 31 has been completely removed in accordance with the method step which follows. FIG. 2b shows this stage with a further layer 33 which has already been deposited on the body 132". Depending on the configuration of the finished capacitor, the layer 33 is deposited on the inner side and/or the outer side thereof. Then, as is essential to the invention, substoichiometric tungsten silicide is deposited on the surface of the columns 132, 132' (with other forms of the body, for example 132", on the surface thereof), as explained in more detail in the description above. FIGS. 2 to 2b show the layer 33 which has then formed. The layer 33 which is deposited is not of a uniform thickness, and therefore the tungsten silicide coating, which is denoted by 133, on the surface of the layer 27 is approximately only half as thick as the tungsten silicide 33 which has been deposited on the column 132. The tungsten silicide that is deposited is substoichiometric, as has been extensively explained in the description given above. There then follows a partial reactive ion etching (RIE) step, by which the thinner coating 133 is etched away at least sufficiently far for the coatings 33 of the individual columns 132 to be electrically isolated from one another. This may reduce the thickness of the coating 33 of the column 132, but the fact that it was previously thicker results in that this coating remains sufficiently thick for the invention.

Figure 3:
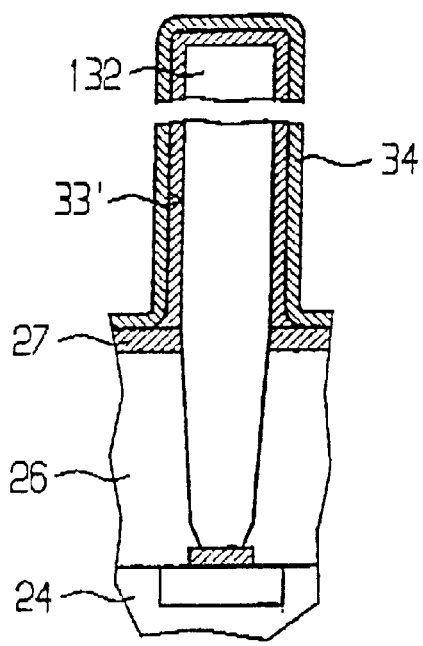
Figure 4:
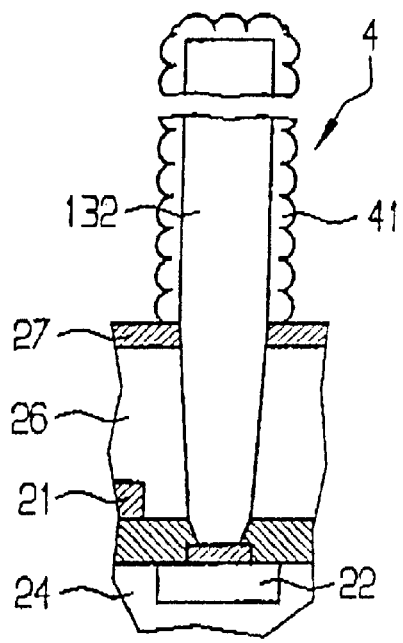

Furthermore, in a manner which is essential to the invention, an additional layer 34 of pure (poly)silicon is then applied to a coating 33' which in each case remains after the etching of the layers 133, 33 (FIG. 3). The next significant method step is a heat treatment of the structure that has now been produced. During this step, the substoichiometric tungsten silicide of the layer 33', together with silicon from the layer 34, changes into a tungsten silicide which, in a manner which is essential to the invention, adopts or undergoes the abovementioned graining 41 (see FIG. 4) of the surface. In this way, the surface area of the first electrode 4 is enlarged a number of times. A following method step is for residual silicon which remains on the tungsten silicide surface, which is now grained, and on the surface of the layer 27, to be etched away again down to the surface of the graining which has formed. This can once again take place using wet-chemical etching. What then remains is the first (bottom) electrode 4 of the capacitor of the corresponding memory cell.

To complete the capacitor, it is recommended to carry out dielectric passivation of the grained surface of the tungsten silicide (bottom) electrode 4 according to the invention. This may, for example, involve thermal nitriding, preferably with a single-layer thickness of less than 1 nm. The dielectric provided for the capacitor is, for example, silicon nitride. This can be applied with the aid of a chemical vapor deposition (CVD) process from $NH_3$ and silane to the surface of the first electrode 4, as layer 5. The first electrode according to the invention, with the grained tungsten silicide surface, may also be coated with tantalum pentoxide as the dielectric 5. Measures for improving the dielectric 5 have already been mentioned in the description above.

Figure 5:
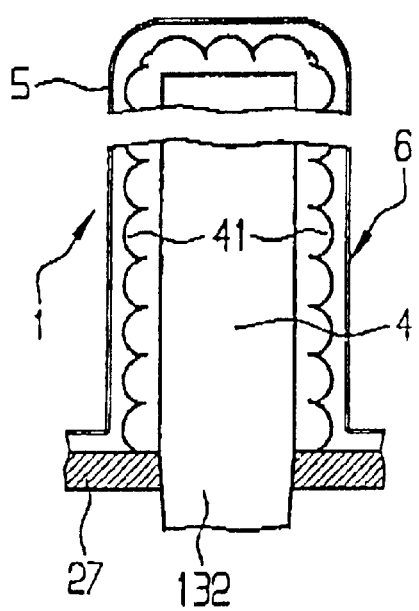

By way of example, titanium nitride may be provided as a second (top) electrode 6. This is applied by conformal deposition to the dielectric layer 5. Further materials that are suitable for the second electrode 6 have been mentioned in the above description. FIG. 5 shows the finished capacitor 1 according to the invention.

The invention has been described above for a capacitor and its fabrication method in a configuration having the first (bottom) electrode 4 with the macroscopic form of the column 132. However, the invention can also be employed for capacitors with other forms of the first electrode 4 with the same success. For this purpose, the recess 32 in the oxide layer 31, in this case the hole 32, is for this purpose if appropriate also to be configured differently in a corresponding way, or the macroscopic form of the core of the first electrode 4 can alternatively also be produced in a different way.

Figure 6:
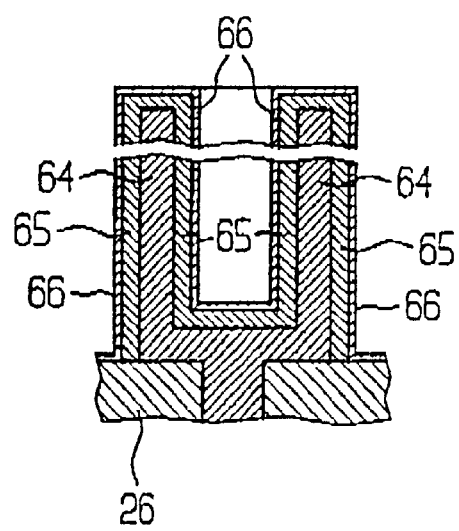
FIG. 6 is a sectional view of a prior art capacitor.

FIG. 6 shows the structure of the storage capacitor from the prior art. A first electrode, which is in this case in the shape of a pot, is denoted by 64. On the surface of the electrode 64 is a dielectric layer 65, and on the dielectric layer 65 is a second electrode 66. The dielectric 65 is tantalum pentoxide on the surface of the tungsten of the first (bottom) electrode.

We claim:

1. A method for fabricating a miniaturized capacitor, which comprises the steps of:
    providing an oxide layer having a recess formed therein;
    fabricating a macroscopically formed body forming part of a first electrode in the recess of the oxide layer, the body having a region formed of tungsten silicide;
    coating the region of the body with a layer of substoichiometric tungsten silicide, $WSi_x$, with x being between 1.5 and 1.9;
    applying a further layer of additive-free silicon to the layer of sustoichiometirc tungsten silicide resulting in a two-layer structure;
    heat treating the body with the two-layer structure in an inert atmosphere, until a grained layer substantially formed of the layer of substoichiometric tungsten silicide is formed;
    coating the body with the grained layer with a dielectric layer; and
    producing a second electrode on the dielectric layer.

2. The method according to claim 1, which comprises fabricating the body all the way through from the tungsten silicide, $WSi_x$, where x=2 to 2.5.

3. The method according to claim 1, which comprises fabricating an inner core of the body from polysilicon, the region of the body formed from the tungsten silicide is $WSi_x$, where x=2 to 2.5 and is disposed on the inner core.

4. The method according to claim 1, which comprises applying the layer of substoichiometric tungsten silicide at a thickness of between 10 and 30 nm.

5. The method according to claim 1, which comprises:
    forming the oxide layer on an etch stop layer and the recess formed in the oxide layer continues in the etch stop layer;
    removing the oxide layer after the body is formed; and
    applying the layer of substoichiometric tungsten silicide on the body and on the etch stop layer such that, on the body, the layer of substoichiometric tungsten silicide layer is applied at a thickness which is at least twice as that as on the etch stop layer.

6. The method according to claim 1, which comprises applying the further layer to a thickness of between 10 and 30 nm.

7. The method according to claim 1, which comprises carrying out the heat treating step continuously in an inert atmosphere at 800° to 1100° C. for from 1 to 10 seconds.

8. The method according to claim 1, which comprises removing parts of the further layer which remain on the grained layer after the heat treating step.

9. The method according to claim 1, which comprises passivating a surface of the grained layer forming the dielectric layer.

10. The method according to claim 9, which comprises performing the passivation step by thermal nitride coating.

11. The method according to claim 10, which comprises carrying out the passivation step with a single-layer thickness of less than 1 nm.

* * * * *